US007437627B2

(12) United States Patent
Frankowsky (10) Patent No.: US 7,437,627 B2
(45) Date of Patent: Oct. 14, 2008

(54) METHOD AND TEST DEVICE FOR DETERMINING A REPAIR SOLUTION FOR A MEMORY MODULE

(75) Inventor: Gerd Frankowsky, Höhenkirchen (DE)

(73) Assignee: Infineon Technologies AG, Munich (DE)

(*) Notice: Subject to any disclaimer, the term of this patent is extended or adjusted under 35 U.S.C. 154(b) by 309 days.

(21) Appl. No.: 10/784,134

(22) Filed: Feb. 20, 2004

(65) Prior Publication Data

US 2004/0223387 A1   Nov. 11, 2004

(30) Foreign Application Priority Data

Feb. 20, 2003   (DE) ................. 103 07 027

(51) Int. Cl.
G11C 29/00   (2006.01)
G11C 7/00   (2006.01)
(52) U.S. Cl. ................ 714/711; 714/723; 365/200
(58) Field of Classification Search ............ 714/7, 714/710, 711, 718, 719, 723; 365/200–201
See application file for complete search history.

(56) References Cited

U.S. PATENT DOCUMENTS

| 4,692,894 | A | * | 9/1987 | Bemis ................ 710/57 |
| 4,939,694 | A | * | 7/1990 | Eaton et al. .......... 365/200 |
| 5,798,974 | A | * | 8/1998 | Yamagata ............ 365/200 |
| 5,808,945 | A | * | 9/1998 | Arase ................ 365/200 |
| 6,115,301 | A | * | 9/2000 | Namekawa ........... 365/200 |
| 6,115,828 | A | * | 9/2000 | Tsutsumi et al. ...... 365/200 |
| 6,145,092 | A | * | 11/2000 | Beffa et al. .......... 714/7 |
| 6,236,615 | B1 | * | 5/2001 | Ozeki ............ 365/230.03 |
| 6,367,030 | B1 | * | 4/2002 | Yamauchi ............ 714/7 |
| 2001/0026486 | A1 | * | 10/2001 | Ogawa et al. ........ 365/201 |
| 2001/0045581 | A1 | * | 11/2001 | Sakata .............. 257/236 |
| 2003/0009615 | A1 | * | 1/2003 | Hsu et al. ............ 711/104 |

FOREIGN PATENT DOCUMENTS

DE   100 16 719 A1   10/2001
WO   WO98/03979   1/1998

OTHER PUBLICATIONS

Session XVIII: Test and Packageing A single Chip Functional Tester by Miyamoto et al. ISSCC 87 Feb. 26, 1987.*
Automatic In-Line Measurement for the Identification of Killer Defects by Wilson et al. Presented at ICMTS 1994.*
Examination Report dated Feb. 20, 2004.

* cited by examiner

*Primary Examiner*—Cynthia Britt
(74) *Attorney, Agent, or Firm*—Patterson & Sheridan, L.L.P.

(57) ABSTRACT

Method for determining a repair solution for a memory module in a test system, memory areas of the memory module being successively tested in order to obtain, for each memory area, a defect datum which specifies whether the respective memory area is defective, wherein defect addresses, the address values of which specify the defective memory areas of the memory module, are generated from addresses of the memory areas and the associated defect data, the defect addresses being stored in the test system, the repair solution being determined from the stored defect addresses.

19 Claims, 6 Drawing Sheets

1-test device
2-memory module
3-address lines
4-data lines
5-comparator circuit
6-defect data memory
7-defect data line

FIG 3A

FIG 3B 10- memory cell array 11- redundant bit line group 12- redundant word line group

FIG 4A

FIG 4B 21-memory module
22-address lines
23-data lines
24-comparator device
25-converter circuit
26-defect address memory
27-test control unit
28-second comparator circuit
29-evaluation unit

FIG 5

21-memory module 30-first memory segment 31-second memory segment 32-first replacement register 33-second replacement register

METHOD AND TEST DEVICE FOR DETERMINING A REPAIR SOLUTION FOR A MEMORY MODULE

CROSS-REFERENCE TO RELATED APPLICATIONS

This application claims foreign priority benefits under 35 U.S.C. §119 to co-pending German patent application number 103 07 027.3, filed Feb. 20, 2003. This related patent application is herein incorporated by reference in its entirety.

BACKGROUND OF THE INVENTION

1. Field of the Invention

The invention relates to a method for determining a repair solution for a memory module in a test system. The invention furthermore relates to a test device for determining a repair solution for a memory module which can be connected to the test device.

2. Description of the Related Art

Memory module, in particular memory modules having dynamic memory cells, DRAMs, cannot be fabricated without defects. Thus, after the fabrication of the memory modules, there are always some defective memory cells among the memory cells. In order to be able to repair these defective memory cells, additional memory cells are provided on the memory module. These additional memory cells are called redundant memory cells.

After the memory module has been fabricated, the functioning of the individual memory cells is checked. By writing to and reading from a memory cell, it is possible in this case to identify defective memory cells. The defect in a memory cell is identified by comparing the datum written in with the datum read out, a defect being identified if the datum written in and the datum read out differ from one another. The comparison between the written and read-out data can be effected both in the memory module itself and in the test system.

The comparison data thus generated are called defect data and specify whether a defect is present in a memory cell. It is often the case that only memory areas having a plurality of memory cells can be replaced by redundant memory areas, so that it suffices for a defect datum to specify whether a defect is present in the memory area. The volume of defect data is thereby reduced.

The test sequence is essentially controlled by a test device containing a defect address memory in which the defect data determined are stored. The defect address memory is essentially a mapping of the memory cell array, a memory location of the defect address memory mapping a memory cell or a memory area having a plurality of memory cells of the memory module. A bit which is set in a memory location of the defect address memory then corresponds to one or a plurality of defective memory cells in the memory module. If the bit is not set, then no defect is present.

The defect address memory serves as a basis for the redundant calculation which is used to perform a replacement of the defective memory cells by a disconnection of the defective memory areas and an activation of redundant memory elements. Memory elements may be, by way of example, word line groups comprising one or a plurality of word lines or bit line groups comprising one or a plurality of bit lines. Since the defect address memory stores the defect data for all the memory areas, that is to say also for functional memory areas, a large defect address memory is necessary in the case of parallel testing of a plurality of memory modules with a large storage capacity. Said defect address memory must have fast access times in order not to reduce the test speed and thus to increase the throughput of the test system.

SUMMARY OF THE INVENTION

It is an object of the present invention to provide a test method, a test device and a test system in which the size of the defect address memory can be reduced.

This object is achieved by means of the methods according to claims 1 and 18, by means of the test device according to claim 7, by means of the test systems according to claim 15.

Further advantageous refinements of the present invention are specified in the dependent claims.

A first aspect of the present invention provides a method for determining a repair solution for a memory module in a test system. Memory areas comprising one or a plurality of memory cells are successively tested in order to obtain, for each memory area, a defect datum which specifies whether the respective memory area is defective. Defect addresses, the address values of which specify the defective memory areas of the memory module, are generated from the addresses of the memory areas and the associated defect data. The defect addresses are stored in the test system, the repair solution being determined from the stored defect addresses.

The method according to the invention has the advantage that the memory size of the defect memory can be chosen to be significantly smaller than heretofore. Conventional test systems are provided with a defect data memory which essentially provides a memory location for each memory area, a defect datum being stored in said memory location. Thus, by way of example, a logic "0" is stored in the memory location if the corresponding memory area in the tested memory module is free of defects. A logic "1" is stored if a defect occurred during the testing of the corresponding memory area.

By contrast, in the case of the invention, it is now provided that when a defect occurs in a memory area of the memory module to be tested, the address of the memory area is determined and said address is stored in the defect address memory of the test device. Since the number of defective memory areas in a memory module is usually relatively small compared with the total number of memory areas or it is possible to repair only a small number of defective memory areas in the memory module, the size of such a defect address memory can be chosen to be significantly smaller than the size of the conventional defect data memory. Since only the defect addresses are necessary for calculating the repair solution, the information about defect-free memory areas can be discarded.

It may furthermore be provided that the memory areas in each case have one or a plurality of memory cells which can be addressed in each case via a word line group—assigned to the address—comprising one or a plurality of word lines and via a bit line group—assigned to the address—comprising one or a plurality of bit lines. The repair solution specifies whether a defective memory area is to be repaired by a replacement of the corresponding word line group by a redundant word line group comprising one or a plurality of redundant word lines or by a replacement of the corresponding bit line group by a redundant bit line group comprising one or a plurality of redundant bit lines.

A number of defective memory areas is mandatorily marked as to be replaced by a redundant word line group if the defective memory areas can be addressed by a common word line group and the number exceeds a first maximum number. A number of defective memory areas is mandatorily marked as to be replaced by a redundant bit line group if the defective memory areas can be addressed by a common bit line group and the number exceeds a second maximum number. The memory areas which are thereby already marked as to be replaced are taken into consideration in the further determination of the redundancy solution by said marked memory areas being assigned an available redundant word line group or an available redundant bit line group.

What is thereby advantageously achieved is that the calculation of the repair solution is simplified by virtue of the fact that defective memory areas, which in any case can only be replaced by a redundant word line group or a redundant bit line group, are marked as to be replaced by the latter. This is done as early as during the determination of the defect addresses. Only the memory areas which have not yet been identified as to be replaced by the redundant word line groups or bit line groups are taken into consideration for the further calculation of the repair solution. This considerably simplifies the method for determining the repair solution since generally a smaller number of defect addresses have to be taken into consideration in the further course of determining the repair solution.

Preferably, the first maximum number corresponds to the number of available redundant bit line groups and/or the second maximum number corresponds to the number of available redundant word line groups. The word line groups or bit line groups would thus be marked as to be replaced, before the actual determination of the repair solution, if there is no other possibility for replacing the corresponding defective memory areas.

A further aspect of the present invention provides a test device for determining a repair solution for a memory module which can be connected to the test device. The test device has a control unit in order to carry out a test operation for memory areas in the memory module. A memory unit is furthermore provided in order to store a value of a defect address which specifies which address of a memory area of the memory module is defective. Furthermore, an evaluation unit is provided, in order to determine the repair solution from the stored defect addresses. The connectable memory module comprises memory areas which in each case have one or a plurality of memory cells. The memory areas can be addressed in each case via a word line group—assigned to the address—comprising one or a plurality of word lines and via a bit line group—assigned to the address—comprising one or a plurality of bit lines. The repair solution specifies whether a defective memory area is to be repaired by a replacement of the corresponding word line group by a redundant word line group comprising one or a plurality of redundant word lines or by a replacement of the corresponding bit line group by a redundant bit line group comprising one or a plurality of redundant bit lines.

In this way, a test device is provided which, depending on the number of defects occurring, manages with a considerably smaller memory requirement for the defect address memory than conventional test devices. By virtue of the fact that only the defect addresses are stored, which specify the defective memory areas, and a mapping of the entire memory of the memory module in the defect data memory of the test system is not performed, memory space for the defect memory can be saved to a considerable extent.

Preferably, each word line group is assigned a first memory segment having a first number of defect address memory locations, in order to store an identified defect address in the corresponding first memory segment of the word line group by means of which the defective memory area can be addressed. Each bit line group is preferably assigned a second memory segment having a second number of defect address memory locations, in order to store an identified defect address in the corresponding second memory segment of the bit line group by means of which the defective memory area can be addressed. The first number corresponds to the number of redundant bit line groups present, and the second number corresponds to the number of redundant word line groups present.

In this way, it is possible to configure the memory unit in the test device in such a way that an assignment of memory locations to word line groups and bit line groups in the memory module to be tested has already been effected beforehand. This enables faster addressing of the defect address memory. Furthermore, it makes it possible to identify, by means of an overflow of the defect address memory locations assigned to a word line group or to a bit line group, that the respective word line group or the respective bit line group is to be replaced by a redundant word line group or a redundant bit line group.

Preferably, during the determination of the repair solution, the evaluation unit unconditionally defines an available redundant word line group as repair solution for the defective memory areas which can be addressed via a word line group, if the first number exceeds the number of redundant bit line groups present. The evaluation unit unconditionally defines a redundant bit line group for the defective memory areas which can be addressed via a bit line group, if the second number exceeds the number of redundant word line groups present.

In this way, without complex calculation, the evaluation unit already establishes beforehand the memory areas which are always to be replaced by an available word line group or a bit line group. Defective memory areas which can only be repaired with the aid of a redundant word line group anyway for lack of a sufficient number of redundant bit line groups are marked as "to be repaired by a redundant word line group". Equally, memory areas which can only be repaired with a redundant bit line for lack of a redundant word line group present are marked as "to be repaired by a redundant bit line".

In the course of the further determination of the repair solution, the defect addresses of the word line and/or bit line groups to be unconditionally replaced are not taken into consideration in the determination of the repair solution with regard to the defect addresses which have remained. A redundant word line group or bit line group is allocated only to the memory areas marked as to be repaired unconditionally by a redundant word line group or bit line group. As a result, the method for determining the repair solution is considerably shortened, since often fewer defect addresses are to be taken into consideration.

Preferably, the test device may have a converter circuit in order to convert defect data assigned to memory areas into defect addresses by the defect address being determined by that address of the memory area at which a defect has been identified. Such a test device receives defect data assigned to corresponding memory areas. The defect data specify whether or not a defect occurred in the respective memory area. By virtue of the fact that the converter circuit is provided in the test device, it is possible to dispense with such a circuit in the memory module.

As an alternative, such a converter circuit may also be provided in a memory module, so that the data to be transmitted to the test device can be considerably minimized since only the defect addresses and not information about defect-free memory areas are transmitted.

A further aspect of the present invention provides a test system having a test device according to the invention and a memory module.

BRIEF DESCRIPTION OF THE DRAWINGS

Preferred embodiments of the invention are explained in more detail below with reference to be accompanying drawings, in which.

DETAILED DESCRIPTION OF THE PREFERRED EMBODIMENT

Figure 1A:
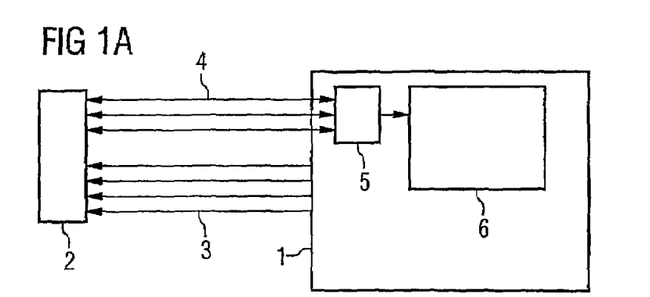
FIGS. 1A, 1B show test system according to the prior art.

FIG. 1A illustrates a test system according to the prior art. The test system has a test device 1, to which a memory module 2 to be tested is connected. The test device 1 makes address data available, which are made available to the memory module 2 to be tested via address lines 3. Via data lines 4, data to be written to the memory cells of the memory module to be tested and also the data read from the memory cells are transmitted between the memory module 2 and the test device 1.

During testing, test data are written to the memory cell of the memory module 2 in accordance with the address prescribed via the address lines 3. Afterward, the written data are read out again via the data lines 4 and the test data written in and the test data subsequently read out again are compared with one another in a comparator circuit 5. If a deviation is established, then the relevant memory cell is defective.

The test device 1 furthermore has a defect data memory, which is essentially a mapping of the memory to be tested in the memory module 2. It may be provided then, that the defect data memory 6 in the test device 1 essentially has the same size as the memory in the memory module 2 to be tested. The defect data produced as a result of the comparison in the comparator device 5 are stored in the defect data memory 6 in such a way that each memory location of the defect data memory 6 is assigned to an address of a memory cell of the memory module 2.

A repair solution is then determined from the defect data stored in the defect data memory 6, which repair solution specifies which redundant memory elements are to replace the relevant defective memory cell. Since the redundant memory elements often comprise one or a plurality of redundant word lines or one or a plurality of redundant bit lines, it suffices for a defect data to specify whether at least one of the memory cells of a memory area which can be replaced by a redundant memory area is defective. In this case, the defect data memory 6 may be smaller than the memory to be tested of the memory module 2. This is because there only a respective defect datum is provided for a memory area, which may have a plurality of memory cells. The defect information is compressed in a redundancy-conforming manner in this way.

Figure 1B:
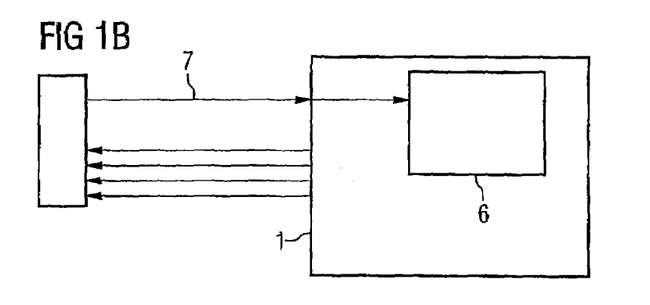

FIG. 1B illustrates a further possibility of a test system. In this case, the comparator circuit 5 is already integrated in the memory module 2, so that only the defect data has to be transmitted to the test device 1 via a corresponding defect data line 7.

Figure 2:
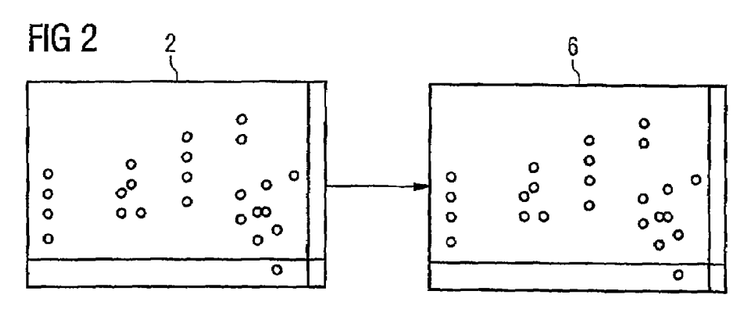
FIG. 2 shows an illustration of the defect data memory mapping the memory cell array of the memory module.

FIG. 2 illustrates how the defect data memory represents a mapping of the memory of the memory module 2. It can be seen that a defect in a memory cell which has occurred in the memory array of the memory module 2 brings about a storage of a corresponding defect datum indicating a defect, e.g. of a logic "1" in the defect data memory 6. A defect file indicating a defect may also be indicated by a logic "1". The hatched circles in the memory of the memory module 2 specify a defective memory cell or a defective memory area. The hatched circles in the defect data memory 6 indicate defect data which indicate a defect in the relevant memory area of the memory module 2, e.g. a logic "1".

Figure 3A:
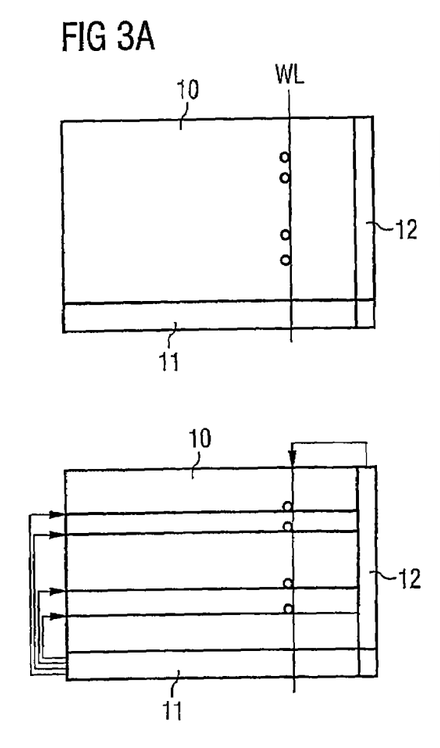
FIGS. 3A, 3B show an illustration for different possibilities for replacing defective memory areas.

FIG. 3A illustrates how, by way of example, four defective memory areas lying along a word line WL can be replaced. A memory cell array 10 is taken as a basis in this case, by way of example, four redundant word line groups 12 and four redundant bit lines groups 11 being provided in the memory module 2 to be tested. A word line group comprises 1 or a plurality of word lines and a bit line group comprises 1 or a plurality of bit lines. The size of the word line group or of the bit line group depends on the intended size of the memory areas that are in each case to be replaced. A word line group in the memory cell array 10 is thus replaced by a redundant word line group of the same size, and a bit line group in the memory cell array 10 is likewise replaced by a redundant bit line group of the same size.

The number of redundant word line groups and redundant bit line groups is defined for a predetermined memory module but is essentially freely selectable and determined by the probability of occurrence of defects in the memory cell array. Generally, each defect in a memory area may be corrected by the replacement of the relevant memory area by a redundant word line group or a redundant bit line group. In the case shown the four defective memory areas which can be addressed via a word line group may be replaced by a redundant word line group or four redundant bit line groups.

Figure 3B:
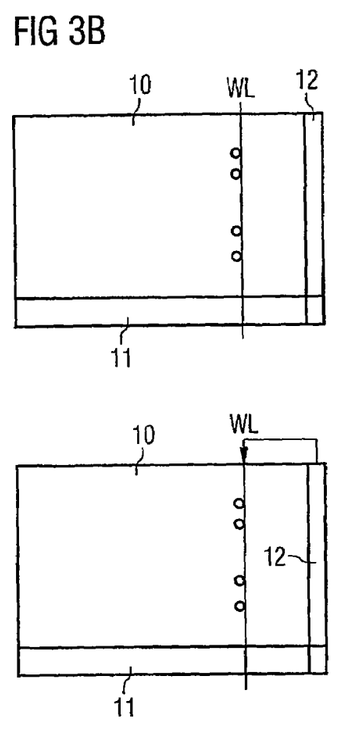

If the number of defective memory areas arranged along a word line group is larger than the number of available redundant bit line groups, these defective memory areas, as illustrated in FIG. 3B, can be completely replaced only by a redundant word line group, but not by redundant bit line groups, since there are not enough redundant bit line groups present.

Thus, if the number of defective memory areas along a word line group or a bit line group does not exceed the number of available redundant bit lines groups or redundant word line groups, then the repair solution is not unambiguous and must be determined in accordance with known methods for determining the repair solution. If the number of defective memory areas along a word line group or along a bit line group exceeds the number of available redundant bit line groups or redundant word line groups, then the corresponding word line groups must be replaced by a redundant word line group or the bit line group must be replaced by a redundant bit line group.

Figure 4A:
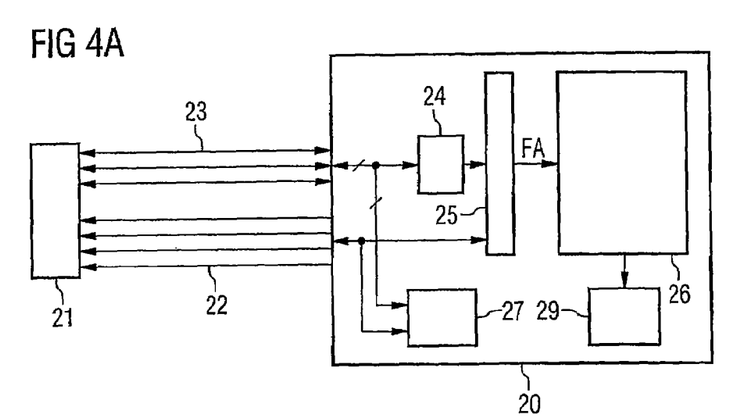
FIGS. 4A, 4B show embodiments for a test system according to the present invention.

FIG. 4A illustrates a first embodiment of a test system according to the invention. A memory module 21 to be tested is connected to a test device 20 via address lines 22 and data lines 23. For the testing of the memory module 21, the test device 20 makes test addresses available via the address lines 22 and also makes test data available via the data lines 23.

In a comparator device 24, the data written in and subsequently read out again are compared and defect data are made available to a converter circuit 25, in which a defect address FA is generated with the aid of the respectively tested address and the defect datum determined, which defect address is stored in a defect address memory 26. The test operation and also the generation of test patterns is carried out in a test control unit 27. If a test circuit is provided in the memory module 21, the test addresses and test data are generated in the memory module 21, so that the test control unit 27 may be obviated.

Figure 4B:
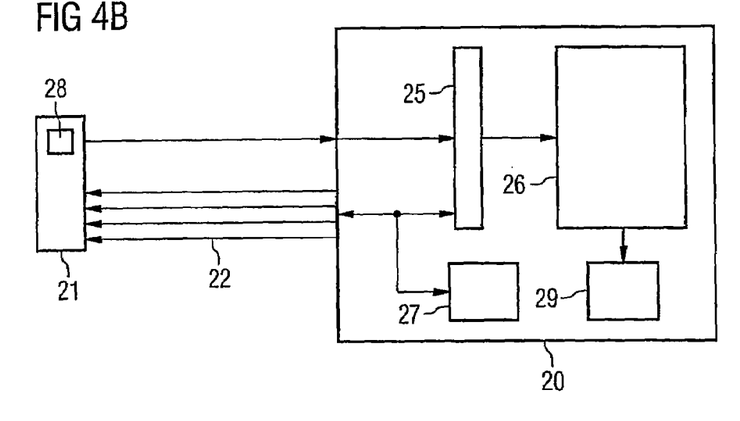

The second embodiment of the test system according to the invention is illustrated in FIG. 4B. The second embodiment differs from the first embodiment essentially by the fact that the comparator circuit 24 is not provided in the test device 20, but rather is provided as second comparator circuit 28 in the memory module 21 to be tested. In this way, it is possible to save data lines for the transmission of the read-out test data, since only the defect data generated by the second comparator circuit 28 provided in the memory module 21 to be tested has to be transmitted to the test device 20.

The defect address memory 26 is connected to an evaluation unit 29, which determines a repair solution from the defect addresses determined. The evaluation unit 29 may be embodied either in the test device 20 or separately from the test device 20.

Figure 5:
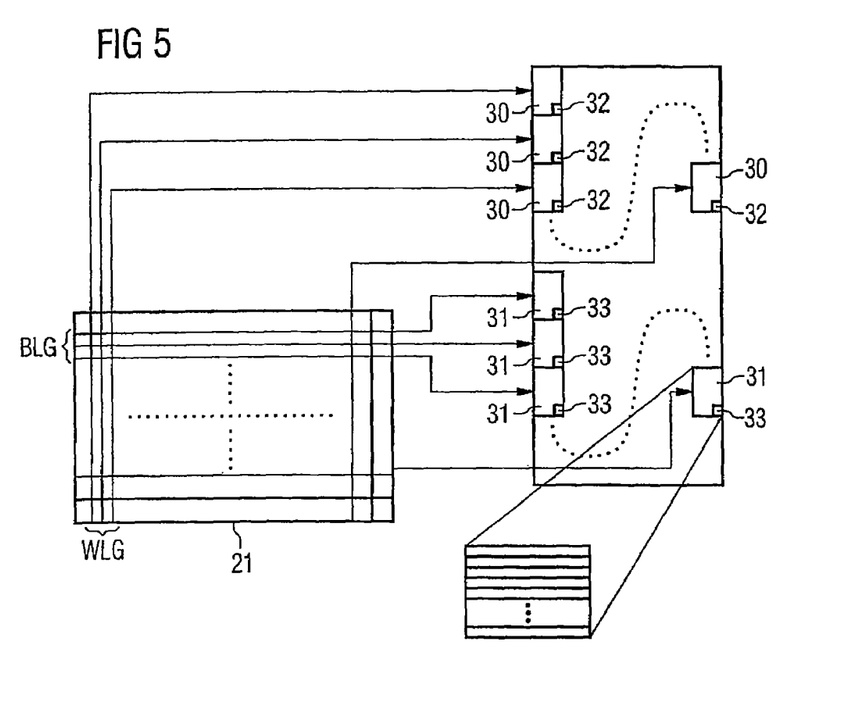
FIG. 5 shows an illustration of the assignment of the memory locations of the memory unit in a test system according to the invention.

FIG. 5 illustrates the construction of a defect address memory as is to be used in the test system according to the invention. The defect address memory 26 is segmented, each of the word line groups WLG in the memory module 21 being assigned a first memory segment 30 in the defect address memory 26 and each of the bit line groups of the memory module 21 being assigned a second memory segment 31 of the defect address memory 26. The first memory segments 30 have a number of address memory locations corresponding to the number of available redundant bit line groups. The second memory segments 31 have a number of address memory locations corresponding to the number of available redundant word line groups.

By virtue of the fact that the defect address memory 26 is of segmented design in this form, a defined memory area in the defect memory 26 is available for each of the word line groups and each of the bit line groups of the memory module to be tested, so that an allocation of a memory area when a defect address is present does not have to be effected. This leads to a time saving when storing the defect addresses.

Furthermore, the defect address memory 26 may be designed such that, in the event of an attempted storage in a defect address in one of the first or second memory segments 30, 31, an overflow of the respective memory segment 30, 31 has the effect that a first or second replacement register 32, 33, the replacement register 32, 33 provided for each of the first and second memory segments 30, 31 of the defect address memory 26 is set to a value which indicates that the respective word line group WLG or bit line group BLG assigned to the respective memory 30, 31 must in any event be replaced by a redundant word line group or redundant bit line group.

During the determination of the repair solution, firstly the memory segments whose assigned replacement registers 32, 33 are set are allocated in each case redundant word line groups or a redundant bit line group. If a replacement register 32, 33 is set, then the word line group assigned to the corresponding memory segment is replaced by a corresponding available redundant word line group and the bit line group assigned to the corresponding memory segment is replaced by an available redundant bit line group. The further determination of the repair solution is then carried out only with regard to the defect addresses which are stored in the first and second memory segments 30, 31 whose assigned replacement register 32, 33 has not been set.

Figure 6A:
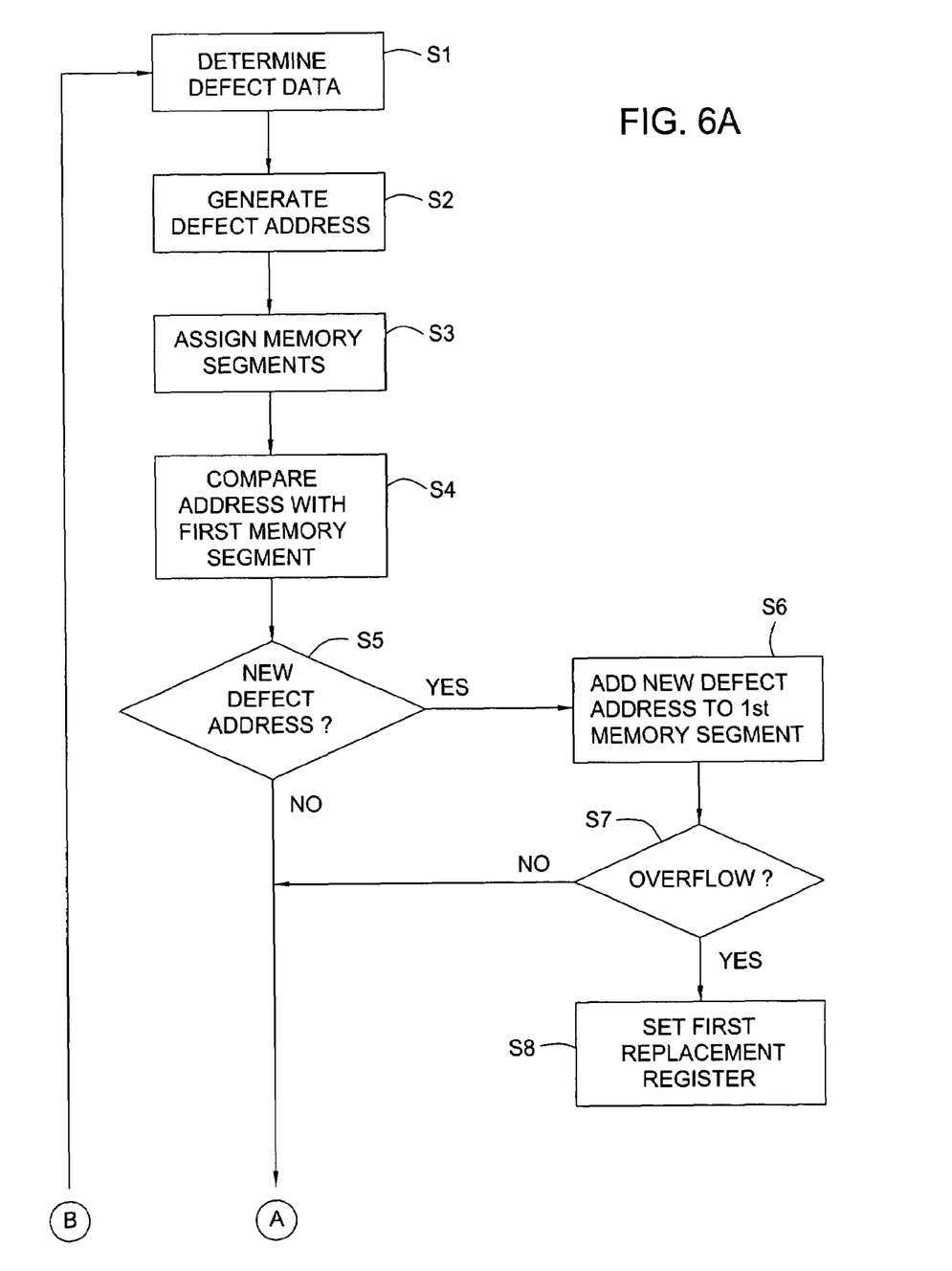
FIGS. 6A, 6B show a flow diagram for illustrating the method according to the invention.
Figure 6B:
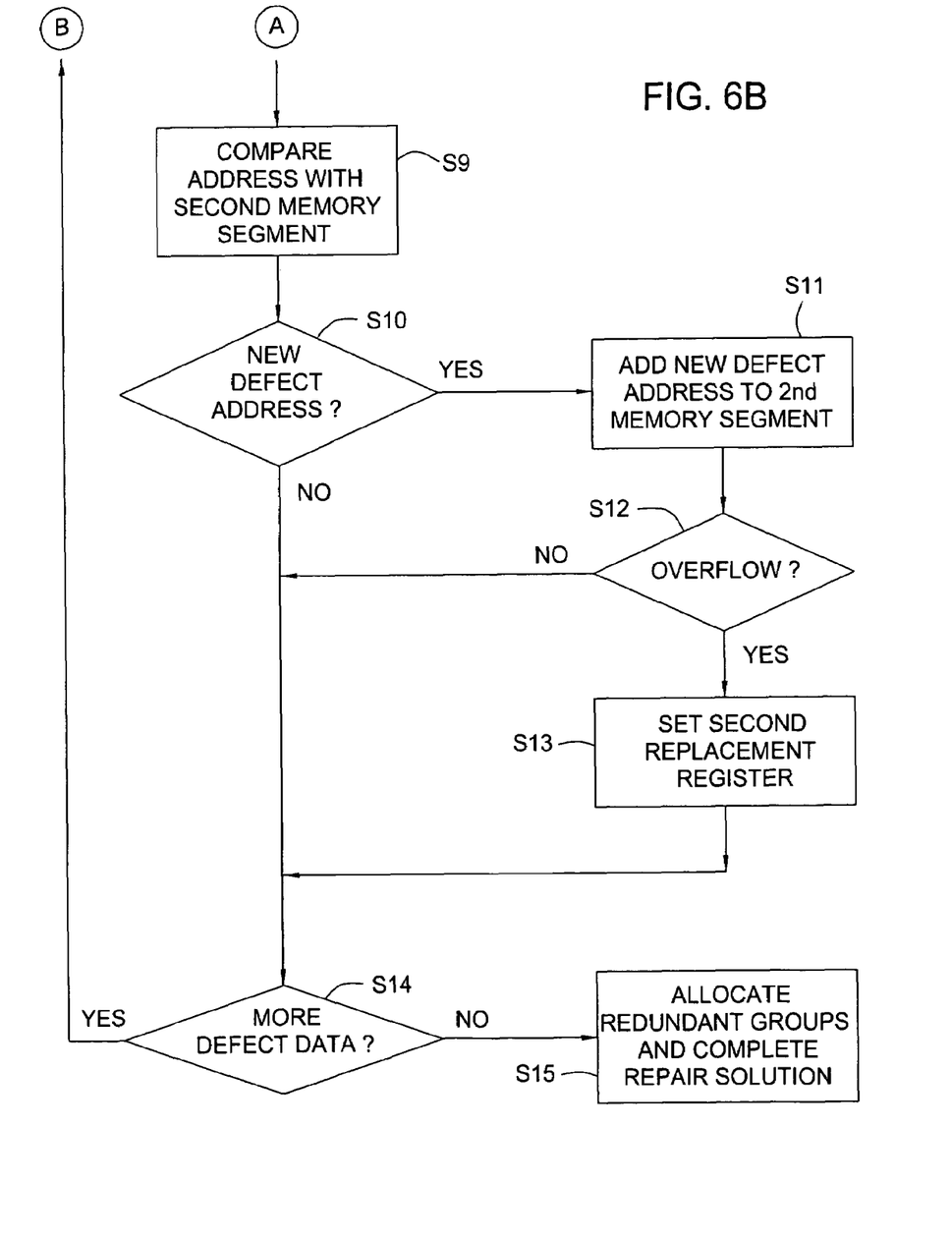

FIGS. 6A and 6B illustrate a flow diagram for an embodiment of the method according to the invention. It relates to the storage of the defect addresses and also to the setting of the replacement registers 32, 33 in the defect address memory 26. In step S1, defect data are determined, which are the result of a comparison of the test data written to the memory cell array and the data subsequently read out. If a defect is indicated by the defect datum, then the tested memory area address respectively assigned to the defect is generated as a defect address in a step S2.

Afterward, in a step S3, the memory segments 30, 31 are provided, which are assigned to the respective word line group or bit line group which address the defective memory area. In a step S4, the defect address determined and the defect addresses stored in the first memory segment are compared with one another. If, in a step S5, it is established that the defect address determined is a new defect address which has not yet been stored in the assigned first memory segment 30, the defect address determined is added to the memory segment (S6). In a step S7, a check is made to determine whether the added defect address leads to an overflow of the first memory segment 30. If so, the first replacement register 32 is set in a step S8.

Afterward, the defect address determined is compared, in a step S9, with the defect addresses stored in the second assigned memory segment. If a defect is established in a step S10, the defect address determined is added, in a step S11, to the defect addresses stored in the memory segment. If the addition of the defect address to the second memory segment leads to an overflow (step S12), then the second replacement register 33 is set (step S13).

If, in step S10, it was established that the defect address is already stored in the second memory segment, the method jumps back to step S1.

If no new defect address is found in step S10 or if the second replacement register is set in step S13, then firstly a check is made, in a step S14, to determine whether further defect data which are to be stored are present. If so, the method jumps back to step S1. If not, firstly the word line groups and bit line groups marked by a set first and/or second replacement register 32, 33 are allocated redundant word line groups or bit line groups and the part of the repair solution is subsequently determined using the defect addresses which remained after the replacement of the word line groups or bit groups already determined (step S15).

The method described above may also provide for only the first memory segments 30 or only the second memory segments to be provided, so that only word line groups or only bit lines groups are determined for replacement before the repair solution is determined with the remaining defect addresses stored in the defect address memory.

What is claimed is:

1. A method for determining a repair solution for a memory module in a test system, the memory module comprising a plurality of word lines and a plurality of bits lines, the method comprising:

determining, for each memory area of the memory module, a defect datum;

generating defect addresses for all defective memory areas;

storing the defect addresses in the test system; and selecting one or more replacement redundant groups based on the defect addresses stored in the test system, wherein the defect addresses are stored in a memory unit which includes, for each of a plurality of word line groups, a first memory segment having a first number of defect address memory locations for storing defect addresses in the respective word line group and, for each of a plurality of bit line groups, a second memory segment having a second number of defect address memory locations for storing defect addresses in the respective bit line group;

wherein each word line group comprises one or more of the word lines and each bit line group comprises one or more of the bit lines.

2. The method of claim 1, wherein the first maximum number corresponds to available redundant bit line groups and the second maximum number corresponds to available redundant word line groups.

3. The method of claim 1, wherein each memory segment includes a replacement register for indicating an overflow condition of the memory segment, and wherein the evaluation unit unconditionally defines a redundant word line group as repair solution for the defective memory areas which can be addressed via a respective word line group if the replacement register for the first memory segment indicates an overflow condition, and unconditionally defining a redundant bit line group as repair solution for the defective memory areas which can be addressed via a respective bit line group, if the replacement register for the second memory segment indicates an overflow condition.

4. The method of claim 1, wherein each memory area is addressable via a respective word line group or via a respective bit line group; and wherein the one or more replacement redundant groups are selected from a redundant word line group if the defective memory areas that are addressable by a common word line group exceeds a first maximum number and from a redundant bit line group if the defective memory areas that are addressable by a common bit line group exceeds a second maximum number.

5. The method of claim 4, wherein the one or more replacement redundant groups are selected for all remaining defective memory areas that were not replaced by one of the redundant word line group and the redundant bit line group.

6. A test device for determining a repair solution for a memory module comprising a plurality of word lines and a plurality of bits lines, the test device, comprising:
a control unit for carrying out a test operation for memory areas in the memory module and determining defective memory areas;
a memory unit for storing defect addresses of defective memory areas;
a converter circuit for converting defect data corresponding to defect memory areas into defect addresses for storing in the memory unit; and
an evaluation unit for selecting one or more replacement redundant groups based on the stored defect addresses, wherein the memory unit includes, for each of a plurality of word line groups, a first memory segment having a first number of defect address memory locations for storing the defect addresses in the respective word line group and, for each of a plurality of bit line groups, a second memory segment having a second number of defect address memory locations for storing the defect addresses in the respective bit line group; wherein each word line group comprises one or more of the word lines and each bit line group comprises one or more of the bit lines.

7. The test device of claim 6, wherein the evaluation unit selects the one or more replacement redundant groups from one or more redundant word line groups and one or more redundant bit line groups.

8. The test device of claim 6, wherein the first number corresponds to available redundant bit line groups on the memory module and the second number corresponds to available redundant word line groups on the memory module.

9. The test device of claim 6, wherein each memory segment includes a replacement register for indicating an overflow condition of the memory segment.

10. The test device of claim 9, wherein the evaluation unit unconditionally defines a redundant word line group as repair solution for the defective memory areas which can be addressed via a word line group if the replacement register for the first memory segment indicates an overflow condition, and unconditionally defining a redundant bit line group as repair solution for the defective memory areas which can be addressed via a bit line group, if the replacement register for the second memory segment indicates an overflow condition.

11. The test device of claim 10, wherein the evaluation unit selects the one or more replacement redundant groups for all remaining defective memory areas that were not replaced by one of the redundant word line group and the redundant bit line group.

12. The test device of claim 6, further comprising:
a comparator circuit for comparing written data and read-out data to generate defect data.

13. A test system, comprising:
a connectable memory module comprising a plurality of word lines and a plurality of bits lines; and
a test device, connectable to the memory module, for determining a repair solution for the memory module, the test device comprising a control unit for carrying out a test operation for memory areas in the memory module and determining defective memory areas, a memory unit for storing defect addresses of defective memory areas, and an evaluation unit for selecting one or more replacement redundant groups based on the stored defect addresses wherein the memory unit includes, for each of a plurality of word line groups, a first memory segment having a first number of defect address memory locations for storing the defect addresses in the respective word line group and, for each of a plurality of bit line groups, a second memory segment having a second number of defect address memory locations for storing the defect addresses in the respective bit line group; wherein each word line group comprises one or more of the word lines and each bit line group comprises one or more of the bit lines.

14. The test system of claim 13, wherein the memory module includes a comparator circuit for comparing written data and read-out data to generate defect data.

15. The test system of claim 13, wherein the test device further comprises a comparator circuit for comparing written data and read-out data to generate defect data.

16. A method for determining a repair solution for a memory module in a test system, comprising:
generating defect addresses corresponding to all defective memory areas of the memory areas of the memory module, the memory module comprising a plurality of word lines and a plurality of bits lines;
storing the defect addresses in a memory unit in the test system, wherein the memory unit includes, for each of a plurality of word line groups, a first memory segment having a first number of defect address memory locations for storing the defect addresses in the respective word line group and, for each of a plurality of bit line group, a second memory segment having a second number of defect address memory locations for storing the defect addresses in the respective bit line group; wherein each word line group comprises one or more of the word lines and each bit line group comprises one or more of the bit lines; and
selecting one or more replacement redundant groups based on the defect addresses stored in the memory unit, wherein the evaluation unit selects the one or more replacement redundant groups from one or more redundant word line groups and one or more redundant bit line groups.

17. The method of claim 16, wherein the first number corresponds to available redundant bit line groups on the memory module and the second number corresponds to available redundant word line groups on the memory module.

18. The method of claim 16, wherein each memory segment includes a replacement register for indicating an overflow condition of the memory segment, and wherein the evaluation unit unconditionally defines a redundant word line group as repair solution for the defective memory areas which can be addressed via a word line group if the replacement register for the first memory segment indicates an overflow condition, and unconditionally defining a redundant bit line group as repair solution for the defective memory areas which can be addressed via a bit line group, if the replacement register for the second memory segment indicates an overflow condition.

19. The method of claim 16, wherein the one or more replacement redundant groups are selected for all remaining defective memory areas that were not replaced by one of the redundant word line group and the redundant bit line group.

* * * * *